(12) United States Patent
Tanaka (10) Patent No.: US 7,660,132 B2
(45) Date of Patent: Feb. 9, 2010

(54) COVERED MULTILAYER MODULE (75) Inventor: Koji Tanaka, Echizen (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/265,948

(22) Filed: Nov. 6, 2008

(65) Prior Publication Data
US 2009/0052149 A1    Feb. 26, 2009

Related U.S. Application Data (63) Continuation of application No. PCT/JP2007/057101, filed on Mar. 30, 2007.

(30) Foreign Application Priority Data
May 17, 2006 (JP) ............................. 2006-138235

(51) Int. Cl.
*H05K 9/00* (2006.01)
(52) U.S. Cl. ...................... 361/816; 361/818; 361/800; 361/799; 361/753; 361/736
(58) Field of Classification Search .................. 361/816, 361/818, 800, 799, 753; 174/350, 377; 310/320; 333/167
See application file for complete search history.

(56) References Cited

U.S. PATENT DOCUMENTS

| | | | | |
|---|---|---|---|---|
| 5,089,794 A | * | 2/1992 | Norimatsu | 331/68 |
| 5,172,077 A | * | 12/1992 | Funada | 331/67 |
| 5,430,933 A | * | 7/1995 | Marx et al. | 29/846 |
| 5,875,099 A | * | 2/1999 | Maesaka et al. | 361/760 |
| 5,898,344 A | * | 4/1999 | Hayashi | 331/67 |
| 5,966,052 A | * | 10/1999 | Sakai | 331/68 |
| 6,025,998 A | * | 2/2000 | Kitade et al. | 361/800 |

(Continued)

FOREIGN PATENT DOCUMENTS

JP      06-252562 A      9/1994

(Continued)

OTHER PUBLICATIONS

Official Communication issued in International Patent Application No. PCT/JP2007/057101, mailed on May 15, 2007.

*Primary Examiner*—Dameon E Levi
(74) *Attorney, Agent, or Firm*—Keating & Bennett, LLP (57) ABSTRACT

A highly reliable covered multilayer module includes a plurality of side electrodes extending in a lamination direction of ceramic layers are provided at least at one of side surfaces of a multilayer module body. At least one of inner conductor layers is exposed at the side surface provided with the side electrodes, in a region interposed between an adjacently arranged pair of the side electrodes. A claw portion of a metal case is soldered to the side electrodes and the inner conductor layer. The plurality of inner conductor layers may be exposed at the side surface of the multilayer module body in the region interposed between the adjacently arranged pair of side electrodes such that at least a part of the inner conductor layer is superposed on the other inner conductor layer when seen in the lamination direction of the ceramic layers. The inner conductor layer may be exposed at the side surface of the multilayer module body such that the inner conductor layer extends from one to the other of the adjacently arranged pair of side electrodes.

3 Claims, 10 Drawing Sheets

U.S. PATENT DOCUMENTS

| | | | |
|---|---|---|---|
| 6,079,099 A * | 6/2000 | Uchida et al. | 29/837 |
| 6,388,535 B1 * | 5/2002 | Otsuki et al. | 331/177 R |
| 6,515,844 B1 * | 2/2003 | Moriwaki et al. | 361/306.1 |
| 6,538,896 B2 * | 3/2003 | Kameda et al. | 361/752 |
| 6,602,616 B2 * | 8/2003 | Sugimoto et al. | 428/688 |
| 6,713,417 B2 * | 3/2004 | Chikagawa et al. | 501/32 |
| 6,751,101 B2 * | 6/2004 | Sakai | 361/736 |
| 6,760,227 B2 * | 7/2004 | Sakai et al. | 361/736 |
| 6,768,898 B2 * | 7/2004 | Furutani et al. | 455/82 |
| 6,817,093 B2 * | 11/2004 | Kitade | 29/852 |
| 6,878,464 B2 * | 4/2005 | Moriya et al. | 428/632 |
| 6,946,415 B2 * | 9/2005 | Chikagawa et al. | 501/32 |
| 7,190,982 B2 * | 3/2007 | Yamamoto et al. | 455/575.1 |

FOREIGN PATENT DOCUMENTS

| | | |
|---|---|---|
| JP | 07-263892 A | 10/1995 |
| JP | 11-238994 A | 8/1999 |

* cited by examiner

FIG. 13
Prior Art

COVERED MULTILAYER MODULE

BACKGROUND OF THE INVENTION

1. Field of the Invention

The present invention relates to multilayer modules, and more particularly, to a covered multilayer module which includes a case arranged to cover a mounting surface of a multilayer module body on which mount devices are mounted on a multilayer board.

2. Description of the Related Art

Recently, the reduction in the size of electronic components is being pursued. A widely used configuration of such electronic components having a reduced size is a multilayer module in which mount devices, such as an IC chip and a capacitor, are mounted on a multilayer board having three-dimensionally arranged inner conductors for a circuit.

Such a multilayer board module includes a covered multilayer module having a case arranged to cover the mount surface on which the mount devices such as the IC chip and the capacitor, are mounted.

Figure 12:
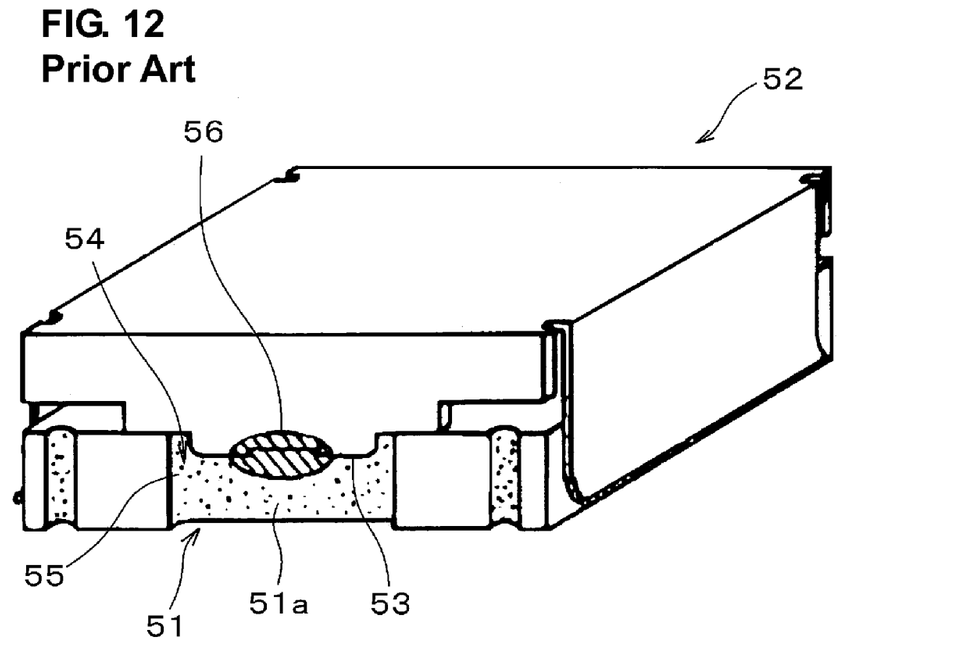
FIG. 12 is an illustration showing an attachment structure of a metal case of a covered multilayer module according to the related art.

As shown in FIG. 12, an example of the covered multilayer module is disclosed in which a claw portion 53 of a metal case 52 is bonded to a multilayer board 51 to define the multilayer module body. In the covered multilayer module, the metal case 52 is attached to the multilayer board 51 by bonding the claw portion 53 of the metal case 52 using solder 56 to a ground electrode 55 which is formed by plating or baking in a recess 54 having a relatively large width and formed at a side surface 51a of the multilayer board 51 (see Japanese Unexamined Patent Application Publication No. 06-252562).

In the above-described covered multilayer module, if the claw portion 53 of the metal case 52 is bonded to the ground electrode 55 having a relatively large width using the solder 56, the claw portion 53 can be reliably bonded to the ground electrode 55. However, when the ground electrode 55 is formed, the mass of the ground electrode 55 is increased, and thus, the ground electrode 55 may be detached from the side surface 51a of the multilayer board 51. As a result, the bonding reliability of the metal case 52 to the ground electrode 55 is insufficient.

A method of manufacturing a plurality of individual ceramic multilayer boards at the same time, i.e., a method of manufacturing plural components at the same time, may be utilized. The method includes forming a through hole in a green mother multilayer board, which becomes a plurality of multilayer boards after dividing, filling the through hole with conductive paste similar to that used to form an inner conductor, firing the mother multilayer board and baking the conductor paste to form a through hole electrode, then dividing the mother multilayer board such that the through hole is cut substantially in half, thus forming individual multilayer boards, each having a bonding electrode arranged to bond the claw portion of the metal case in which the substantially half-cut through holes (recesses) are filled with the conductor, and bonding the claw portion of the metal case to the bonding electrode of the individual multilayer board. In this manner, the plurality of individual ceramic multilayer boards with the claw portions of the cases being bonded to the bonding electrodes are manufactured. In the case in which the method is utilized, the area, i.e., the width, of the bonding electrode may not be sufficiently large.

In particular, when utilizing the method of manufacturing the plural components at the same time, if the area of the bonding electrode is increased, the diameter of the through hole must be increased. In this case, the conductive paste filled in the through hole may be detached, and thus, it is difficult to form a reliable bonding electrode having the large area. Consequently, when the claw portion of the metal case is soldered to the bonding electrode, the bonding strength of the metal case with respect to the multilayer board may be insufficient, or the solder bonding portion may be detached due to a load, such as its mass, resulting in a reduced reliability.

In addition, even when the above-mentioned method of manufacturing the plural components is not utilized, due to the demand to reduce the size of the electronic components, it is difficult to increase the width of the bonding electrode arranged to bond the claw portion of the metal case at the side surface of the multilayer board. If the claw portion of the metal case is soldered to a plurality of the bonding electrodes, it is still difficult to sufficiently ensure the bonding reliability.

Figure 13:
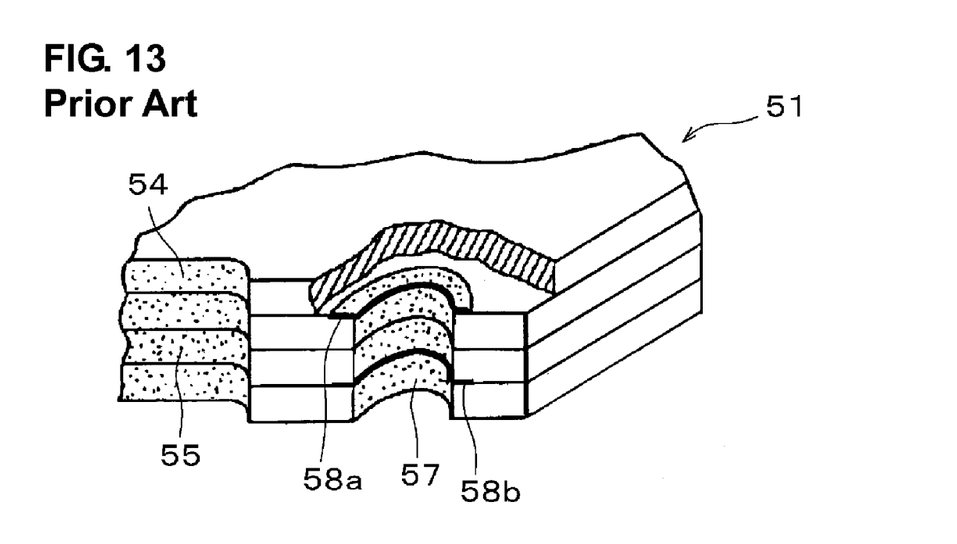
FIG. 13 is an enlarged illustration showing a primary portion of the covered multilayer module according to the related art.

As shown in FIG. 13, Japanese Unexamined Patent Application Publication No. 06-252562 also discloses a configuration of a covered multilayer module, in which substantially U-shaped reinforcing conductors 58a and 58b are connected to an end electrode 57 arranged at a narrow recess provided along a lamination direction, as a connection electrode to an external device, so as to provide a reliable connection with the external device. The electrode is not provided to bond the claw portion 53 of the metal case 52, and even if the electrode is used to bond the claw portion 53 of the metal case 52, when the end electrode 57 has a relatively small width as shown in FIG. 13, it is difficult to provide sufficient bonding strength.

SUMMARY OF THE INVENTION

To overcome the problems described above, preferred embodiments of the present invention provide a highly reliable covered multilayer module having improved bonding strength between a case and a multilayer board without requiring a complicated structure or increasing the size of the product.

A covered multilayer module according to a preferred embodiment of the present invention includes a multilayer module body in which a mount device is mounted on a multilayer board, and a metal case arranged to cover at least one principal surface of the multilayer module body. The multilayer module body includes a plurality of laminated ceramic layers and at least one inner conductor layer, the inner conductor layer being disposed between the ceramic layers. The multilayer module body includes a pair of opposed principal surfaces and side surfaces connecting the pair of opposed principal surfaces. A plurality of side electrodes extending in a lamination direction of the ceramic layers are provided on at least one of the side surfaces. At least one of the inner conductor layers is exposed at the side surface provided with the plurality of side electrodes, in a region interposed between an adjacently arranged pair of the side electrodes. The metal case includes a top plate and a claw portion. The claw portion is arranged to extend along the side surface of the multilayer module body provided with the side electrodes. The claw portion is soldered to the side electrodes and the inner conductor layer exposed at the side surface.

Preferably, the plurality of inner conductor layers are exposed at the side surface of the multilayer module body in the region interposed between the adjacently arranged pair of side electrodes such that at least a portion of the inner conductor layer is superposed on the other inner conductor layer when viewed in the lamination direction of the ceramic layers.

Preferably, the inner conductor layer is exposed at the side surface of the multilayer module body such that the inner conductor layer extends from one of the adjacently arranged pair of side electrodes to the other of the adjacently arranged pair of side electrodes.

The plurality of side electrodes extending in the lamination direction of the ceramic layers are preferably provided at least at the one of the side surfaces of the multilayer module body. The at least one of the inner conductor layers is exposed at the side surface of the multilayer module body provided with the plurality of side electrodes, in the region interposed between the adjacently arranged pair of side electrodes. The claw portion of the metal case is soldered to the side electrodes of the multilayer module body and to the inner conductor layer exposed at the side surface. Accordingly, a highly reliable covered multilayer module can be provided in which the case has a relatively large bonding strength with respect to the multilayer module body without requiring a complicated structure or increasing the size of the product.

In particular, in the covered multilayer module according to preferred embodiments of the present invention, the at least one of the inner conductor layers is preferably exposed at the side surface of the multilayer module body provided with the plurality of side electrodes, in the region interposed between the adjacently arranged pair of side electrodes. Thus, when the claw portion of the metal case is soldered to the plurality of side electrodes, the claw portion can be soldered not only to the side electrodes, but also to the inner conductor layer exposed at the side surface, and the inner conductor layer receives solder at the side surface of the multilayer module body. Therefore, the bonding strength of the metal case with respect to the multilayer module body can be improved without using a special element or increasing the size of the product to increase the area of the side electrodes, thereby obtaining a highly reliable covered multilayer module.

In preferred embodiments of the present invention, the phrase, "the plurality of side electrodes extending in the lamination direction of the ceramic layers", means the arrangement of the side electrodes such that each of the plurality of side electrodes is provided at the plurality of ceramic layers so as to extend across the ceramic layers in the thickness direction, but does not mean that the side electrode has a longitudinal dimension in the lamination direction of the ceramic layers. Thus, the shape of the side electrode is not limited to any specific shape, and may have any suitable shape.

The plurality of inner conductor layers are preferably exposed at the side surface of the multilayer module body in the region interposed between the adjacently arranged pair of side electrodes such that at least the portion of the inner conductor layer is superposed on the other inner conductor layer when viewed in the lamination direction of the ceramic layers. With this arrangement, the flow of solder in the lamination direction of the ceramic layers can be controlled and prevented, and the solder can be reliably maintained at the side surface of the multilayer module body. Accordingly, the bonding strength of the metal case with respect to the multilayer module body can be further improved.

Figure 3:
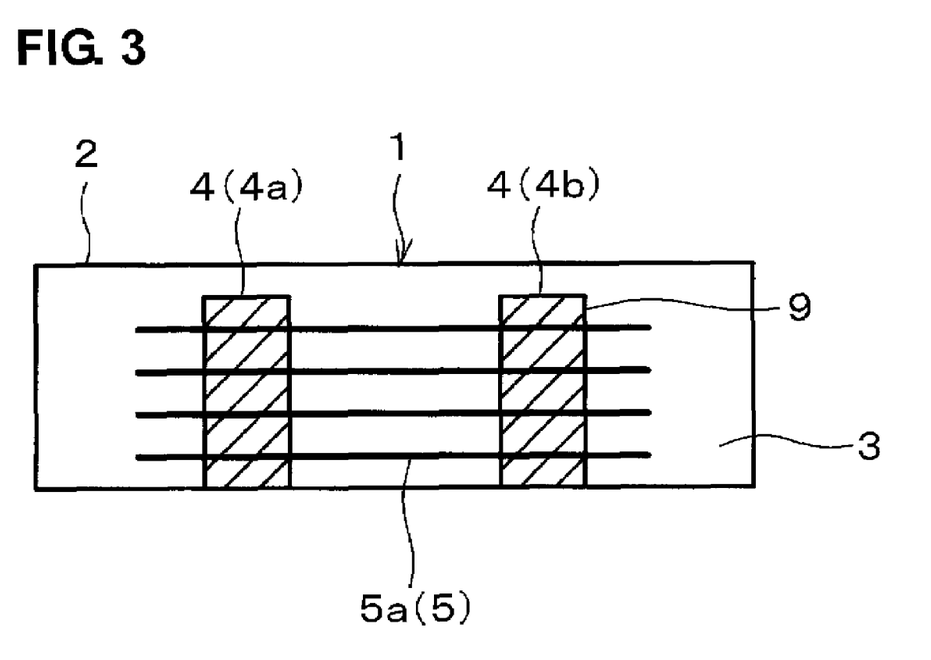
FIG. 3 is an illustration showing a side surface of a multilayer module body of the covered multilayer module according to the first preferred embodiment of the present invention.
Figure 6:
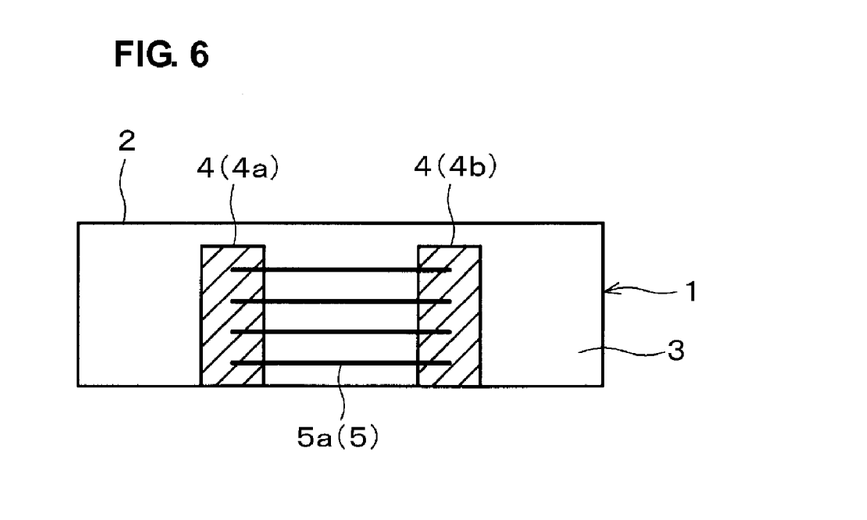
FIG. 6 is an illustration showing a side surface of a multilayer board (multilayer module body) of a covered multilayer module according to a second preferred embodiment of the present invention.

The expression, "the plurality of inner conductor layers are exposed at the side surface such that at least the portion of the inner conductor layer is superposed on the other inner conductor layer when seen in the lamination direction of the ceramic layers", means various arrangements in which the plurality of inner conductor layers extend from one of the pair of side electrodes to the other of the pair of side electrodes as shown in FIGS. 3 and 6; an arrangement in which an inner conductor layer extending from the one side electrode toward the other side electrode but not reaching the other side electrode is provided, an inner conductor layer extending from the other side electrode toward the one side electrode but not reaching the one side electrode, and tip end portions of both inner conductor layers are superposed when viewed in the lamination direction of the ceramic layers.

The inner conductor layer is preferably exposed at the side surface of the multilayer module body such that the inner conductor layer extends from one of the adjacently arranged pair of side electrodes to the other of the adjacently arranged pair of side electrodes. With this arrangement, the solder can be further reliably maintained at the region interposed between the pair of side electrodes, thereby sufficiently ensuring the bonding strength of the metal case with respect to the multilayer module body. Accordingly, a highly reliable covered multilayer module can be provided.

In addition, in preferred embodiments of the present invention, the inner conductor layer may be exposed at the side surface such that the inner conductor layer extends from one of the adjacently arranged pair of side electrodes to the other of the adjacently arranged pair of side electrodes, and extend to the outside of the pair of side electrodes. With this arrangement, the soldering area can be increased, and the solder-holding capability can be improved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Features of the present invention are described below in more detail with reference to preferred embodiments of the present invention.

First Preferred Embodiment

Figure 1:
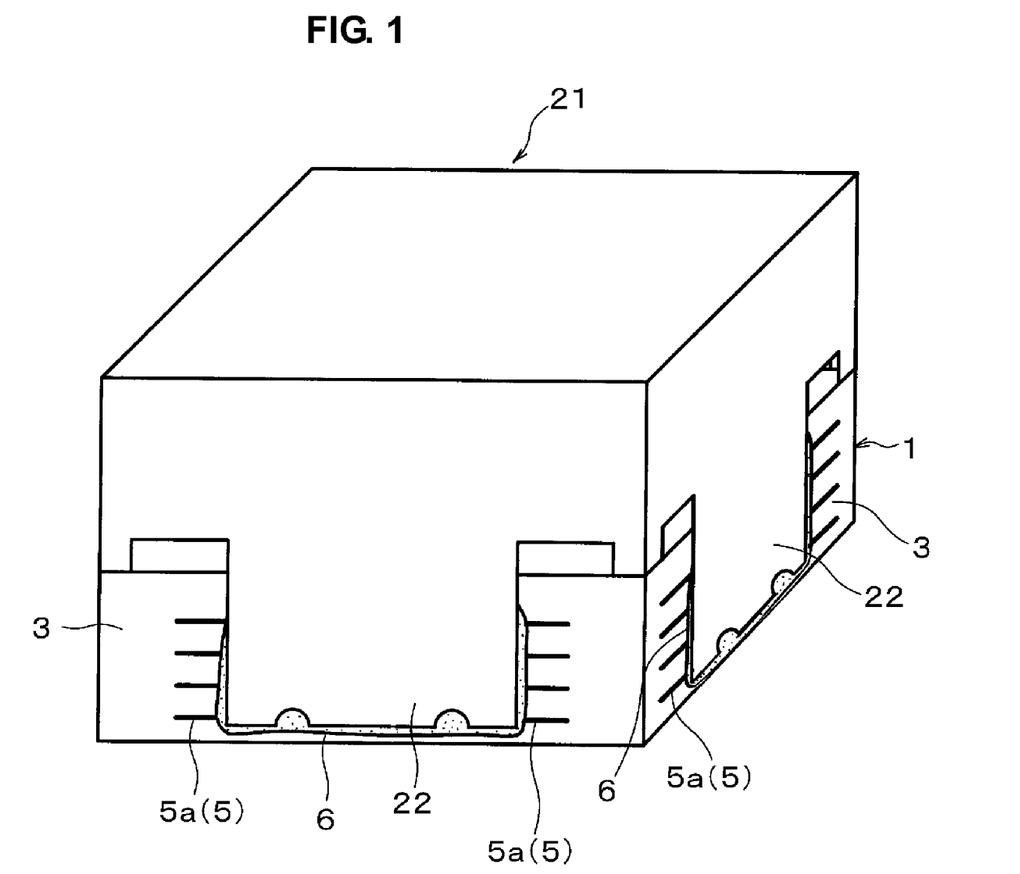
FIG. 1 is a perspective view showing a configuration of a covered multilayer module according to a preferred embodiment of the present invention.
Figure 2:
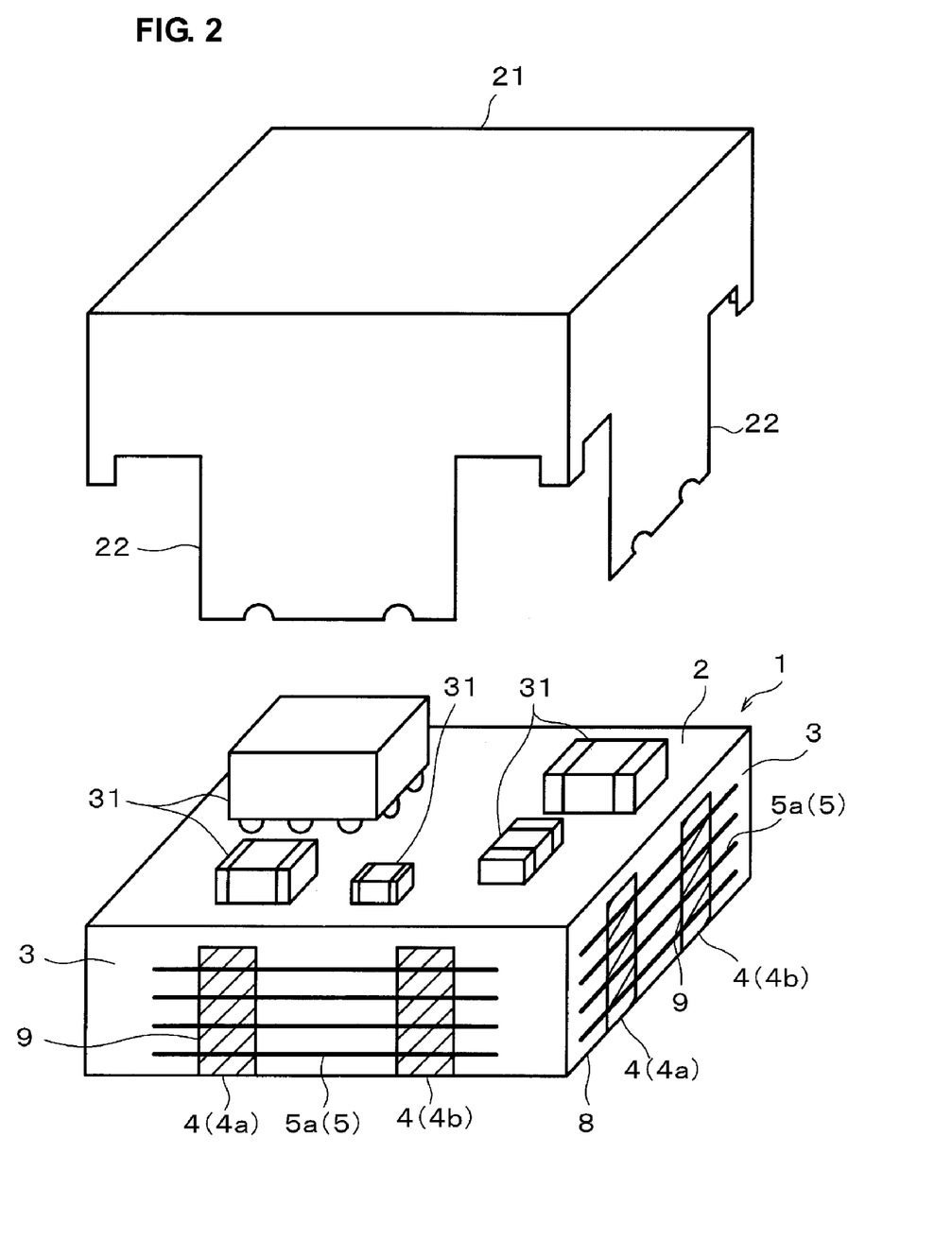
FIG. 2 is an exploded perspective view showing a configuration of a covered multilayer module according to a first preferred embodiment of the present invention.

FIG. 1 is a perspective view showing a configuration of a covered multilayer module according to a first preferred embodiment of the present invention, and FIG. 2 is an exploded perspective view of FIG. 1.

As shown in FIGS. 1 and 2, the covered multilayer module includes a multilayer module body (multilayer board) 1 in which mount devices 31 are mounted on a first principal surface 2 of the multilayer module body 1, and a metal case 21 arranged to cover the first principal surface 2 of the multilayer module body 1.

The metal case 21 is fixed to the multilayer module body 1 by connecting a claw portion 22 of the metal case 21 using solder 6 to side electrodes 4 disposed on a side surface 3 of the multilayer module body 1 and to exposed portions 5a of inner conductor layers 5 exposed at the side surface 3.

The configuration of the covered multilayer module is described in more detail below.

In the covered multilayer module of this preferred embodiment, the multilayer module body 1 is formed by laminating a plurality of ceramic layers each having an inner conductor layer with a predetermined pattern provide on the surface, by, for example, printing. Lands (not shown) for mounting mount devices are provided on the first principal surface 2, so that the mount devices 31, such as an IC chip, a chip filter, a chip condenser, a chip resistance, and other suitable devices, for example, are mounted on the lands.

Outer electrodes (not shown) by which the multilayer module is to be connected to another board, for example, are provided on a second principal surface 8 of the multilayer module body 1.

The side electrodes 4, to which the claw portion 22 of the metal case 21 is connected, are disposed at the side surface 3 of the multilayer module body 1. The side electrodes 4 are made of an electrode material filled in recesses 9. The electrode material of the side electrodes 4 is substantially the same as that of the inner conductor layers 5.

In this preferred embodiment, two side electrodes 4 (4a, 4b) are preferably provided at each side surface 3 of the multilayer module body 1, for example.

In this preferred embodiment, the side electrodes 4 (4a, 4b) are preferably formed by baking conductive paste filled in the recesses formed at the side surface 3 of the multilayer module body.

In addition, the inner conductor layers 5 disposed in the multilayer module body 1, in particular, ends portions 5a of the inner conductor layers 5, are exposed at the side surface 3 of the multilayer module body 1. Each of the plurality of exposed portions 5a of the inner conductor layers 5 preferably extends from one side electrode 4a to the other side electrode 4b so as to be connected to the side electrodes 4a and 4b, and extends to regions outside the side electrodes 4a and 4b.

In this preferred embodiment, the plurality of end portions 5a the inner conductor layers 5 are exposed at the side surface 3 of the multilayer module body 1. Each of the plurality of exposed end portions 5a of the inner conductor layers 5 extends from one of the adjacently arranged pair of side electrodes 4a to the other of the adjacently arranged pair of side electrodes 4b, and extends to regions outside the side electrodes 4a and 4b.

The multilayer module of this preferred embodiment includes, as the inner conductor layers 5, a wiring inner-conductor layer, and a ground-electrode inner-conductor layer. Preferably, a predetermined layer among the inner conductor layers 5 defining ground electrodes is exposed at the side surface 3 of the multilayer module body 1, as required.

In the multilayer module, the plurality of inner conductor layers 5 include end portions 5a that are exposed at the side surface 3 of the multilayer module body 1 in a region interposed between the adjacently arranged pair of side electrodes 4a, 4b, and the claw portion 22 of the metal case 21 is soldered to the two side electrodes 4a, 4b and the exposed end portions 5a of the inner conductor layers 5 exposed at the side surface 3 of the multilayer module body 1. Accordingly, the claw portion 22 of the metal case 21 is soldered not only to the side electrodes 4a, 4b, but also to the inner conductor layers 5, and the plurality of inner conductor layers 5 exposed at the side surface 3 enable the solder 6 to be maintained at the side surface 3 of the multilayer module body 1. This enables the bonding strength of the metal case 21 with respect to the multilayer module body 1 to be sufficiently ensured, thereby providing a highly reliable covered multilayer module, without complicating the manufacturing procedure due to the use of a special element, or increasing the size of a product due to an increased area of the side electrodes.

Next, a method of manufacturing the multilayer module will be described.

Fabrication of Ceramic Green Sheet with Inner Conductor Layer Printed

First, mother ceramic green sheets for forming the multilayer module body 1, in particular, a ceramic green sheet having a ground-electrode inner-conductor layer 5G (hereinafter, also merely referred to as "ground electrode 5G") printed thereon, and a ceramic green sheet having a wiring inner-conductor layer printed thereon are prepared.

At this time, as shown in FIG. 3, to enable the inner conductor exposed portions 5a to be exposed at the side surface 3 of the multilayer module body 1 such that each of the inner conductor exposed portions 5a extends from one side electrode 4a to the other side electrode 4b so as to be connected to the side electrodes 4a and 4b, and extends to the regions outside the side electrodes 4a and 4b, a ceramic green sheet SG1 (FIG. 4) and a ceramic green sheet SL1 (FIG. 5) are prepared. The ceramic green sheet SG1 which defines a plurality of child boards 11 includes through holes 14a and 14b (FIG. 4) provided at locations at which the recesses for forming side electrodes are formed, and the ground-electrode inner-conductor layer 5G for the plurality of child boards 11, which is printed thereon in a matrix form. The ceramic green sheet SL1 which defines another plurality of child boards 11 includes through holes 14a and 14b (FIG. 4) provided at locations at which the recesses for forming side electrodes are formed, and the wiring inner-conductor layer 5L for the other plurality of child boards 11, which is printed thereon in a matrix arrangement.

Figure 4:
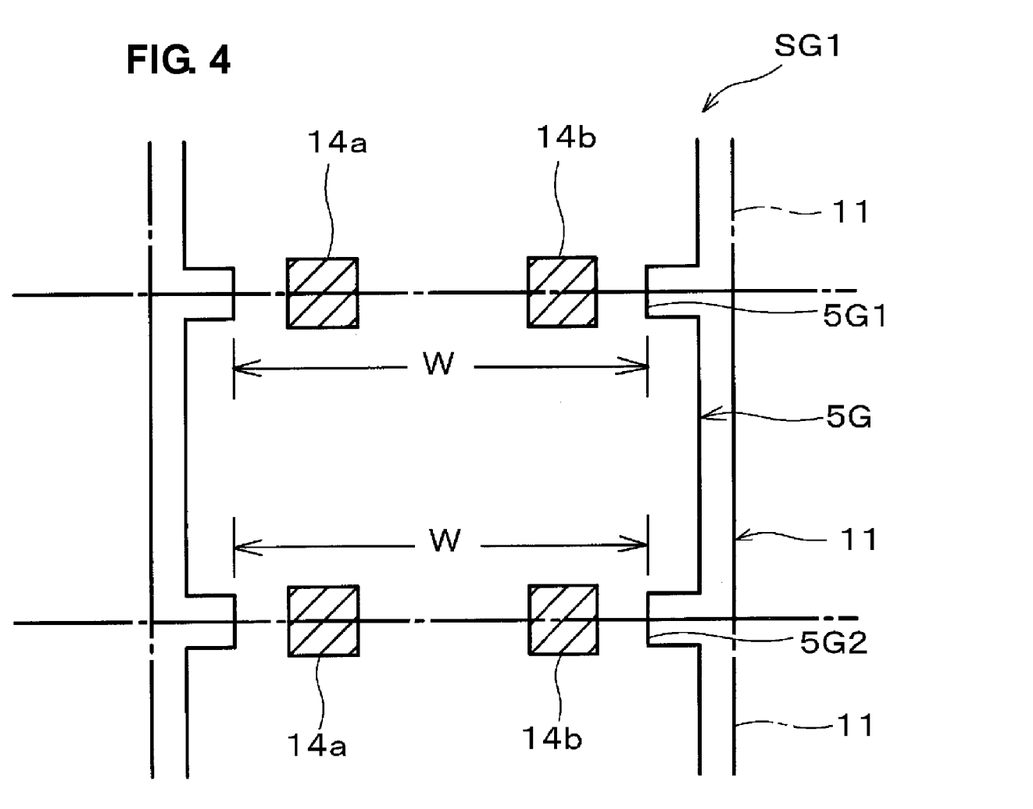
FIG. 4 is an illustration showing a method of exposing a ground-electrode inner-conductor layer at the side surface of the multilayer module body, in a manufacturing procedure of the covered multilayer module according to a preferred embodiment of the present invention.

In the ceramic green sheet SG1 on which the ground-electrode inner-conductor layer 5G is formed, as shown in FIG. 4, the pair of through holes 14a and 14b for forming side electrodes are formed at the locations at which the recesses for forming the side electrodes 4 (FIG. 3) are formed, for example, at upper and lower boundary portions with respect to the adjacent child boards 11.

The print pattern of the ground-electrode inner-conductor layer 5G is a print pattern in which an upper-side protrusion 5G1 and a lower-side protrusion 5G2 extend to ends of the child board 11 (in FIG. 4, upper and lower ends), and are connected to the ground electrode 5G of the adjacent child boards 11. A width W of the upper-side protrusion 5G1 and that of the lower-side protrusion 5G2 of the ground electrode 5G are set such that the upper-side protrusion 5G1 and the lower-side protrusion 5G2 each protrude outside of opposed ends of the pair of through holes 14a and 14b which do not face each other.

When the conductive paste is printed on the ceramic green sheet SG1 to form the ground-electrode inner-conductor layer 5G, the conductive paste is also printed on the through holes 14a and 14b, so as to form electrodes, which define the side electrodes after dividing.

In the ceramic green sheet SL1 including the wiring inner-conductor layer 5L printed thereon, in order to enable the inner conductor exposed portions 5a to be exposed in the manner shown in FIG. 3, floating electrodes 35 are formed in addition to the wiring inner-conductor layer 5L.

Figure 5:
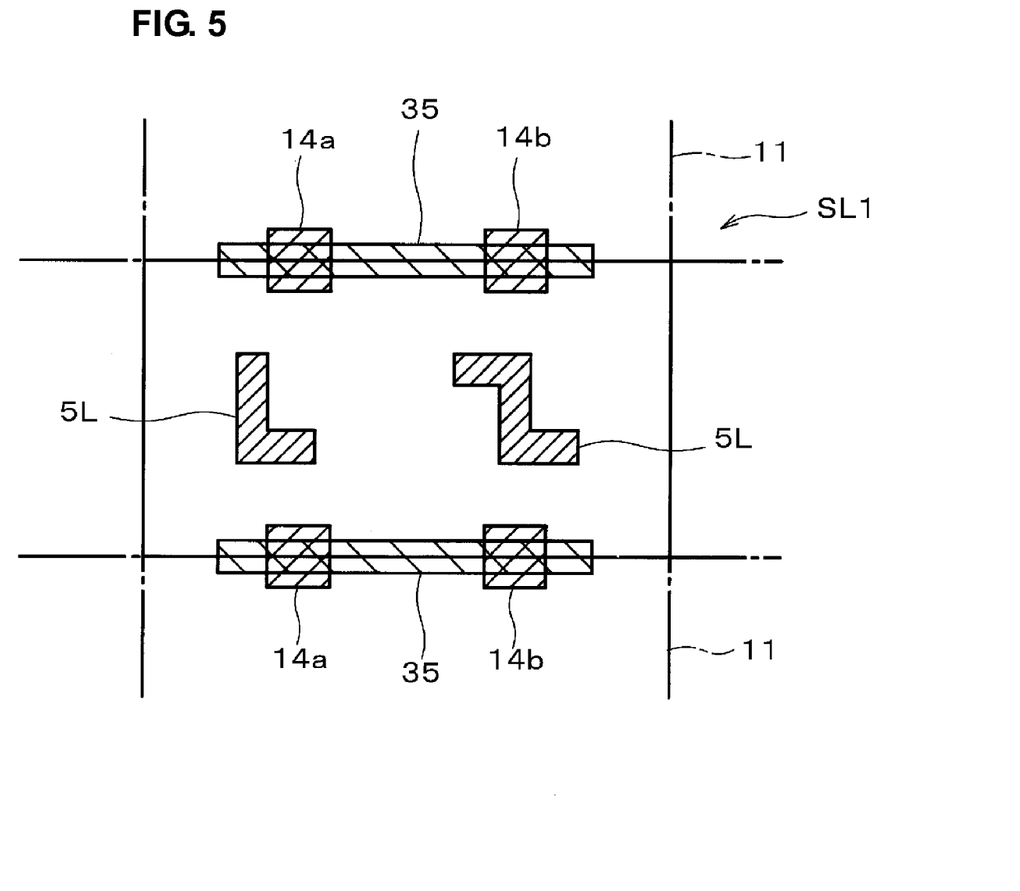
FIG. 5 is an illustration showing a method of exposing an inner-conductor layer at the side surface of the multilayer module body when the inner-conductor layer is coplanar with a wiring inner-conductor, in the manufacturing procedure of the covered multilayer module according to the first preferred embodiment of the present invention.

In particular, as shown in FIG. 5, a pair of through holes 14a and 14b are formed at the ceramic green sheet SL1, which becomes a layer provided with the wiring inner-conductor layer 5L, at locations at which the recesses for the side electrodes are formed, for example, at the upper and lower boundary portions with respect to the adjacent child boards 11.

Then, the conductive paste for the wiring inner-conductor layer 5L is printed in a predetermined region, and the conductive paste is also printed in regions including the through holes 14a and 14b. Accordingly, the band-shaped floating electrodes 35 are formed, each extending from a region outside the outer end of one through hole 14a to a region outside the outer end of the other through hole 14b. In addition, the through holes 14a and 14b are filled with the conductive paste to define electrodes, which become the side electrodes after dividing.

When preparing the ceramic green sheets SG1 and SL1, via holes for inter-layer connection are simultaneously formed, if necessary. The via holes are filled with conductive paste to define via hole conductors.

Lamination and Firing of Ceramic Green Sheet

Next, ceramic green sheets including a ceramic green sheet on which an inner conductor layer is not printed and the ceramic green sheets SG1 and SL1 having the inner conductor layers printed thereon as described above are laminated in a predetermined order to form a mother laminated body, and then the mother laminated body is fired under predetermined conditions.

Mounting of Mount Device and Dividing

Next, mount devices are mounted on the multilayer module bodies of the fired mother laminated body.

Then, the mother laminated body is divided at the boundary portions with respect to the adjacent child boards 11.

Accordingly, as shown in FIG. 2, the multilayer module body 1 is provided in which the mount devices 31 are mounted, and the side electrodes 4a, 4b and the inner conductor exposed portions 5a are exposed at the side surface 3 (see FIG. 3).

Attachment of Metal Case

Next, as shown in FIGS. 1 and 2, the metal case 21 is attached to the multilayer module body 1, and the solder 6 is applied to the side surface 3 of the multilayer module body 1 in the vicinities of the side electrodes 4a, 4b and the inner conductor exposed portions 5a, i.e., the solder 6 is applied to the bonding portion between the claw portion 22 of the metal case 21 and the multilayer module body 1. Then, by reflowing, the claw portion 22 of the metal case 21 is soldered to the side electrodes 4 and the inner conductor exposed portions 5a at the side surface 3 of the multilayer module body 1, so that the metal case 21 is bonded and fixed to the multilayer module body 1. Accordingly, the multilayer module having the structure as shown in FIGS. 1 and 2 is provided.

In the first preferred embodiment, while the inner conductor pattern 5, which becomes the exposed inner conductor layer 5a, is provided on the layer provided with the ground electrode 5G and on the layer provided with the wiring inner-conductor layer 5L, at least one inner conductor pattern 5, which becomes the exposed inner conductor layer 5a, may preferably be provided at a desired layer.

Second Preferred Embodiment

FIG. 6 is an illustration showing the structured of a side surface of a multilayer module body of a multilayer module according to a second preferred embodiment of the present invention.

In the multilayer module of the second preferred embodiment, as shown in FIG. 6, each of the plurality of inner conductor layers 5 exposed at the side surface 3 of the multilayer module body 1 extends from one of an adjacently arranged pair of side electrodes 4a and 4b toward the other of the adjacently arranged pair of side electrodes 4a and 4b, but does not extend to the regions outside the side electrodes 4a and 4b.

Such a multilayer module according to the second preferred embodiment may preferably be manufactured, for example, by a method described below.

Figure 7:
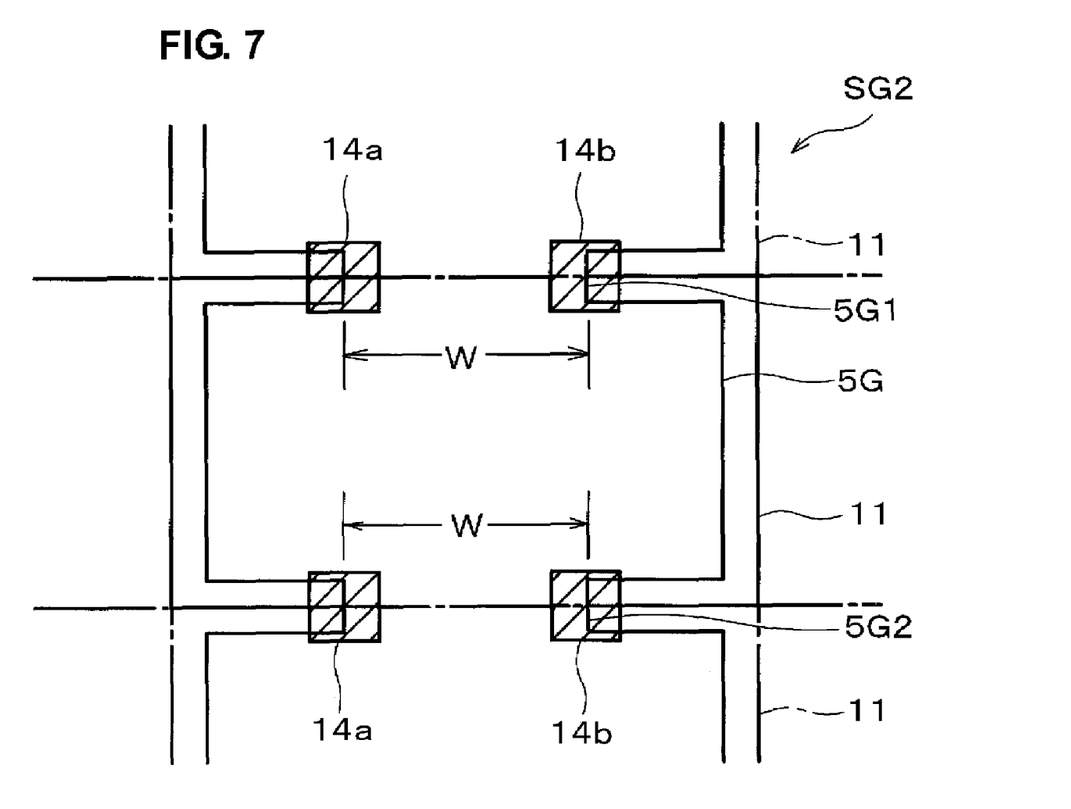
FIG. 7 is an illustration showing a method of exposing a ground-electrode inner-conductor layer at the side surface of the multilayer module body, in a manufacturing procedure of the covered multilayer module according to the second preferred embodiment of the present invention.
Figure 8:
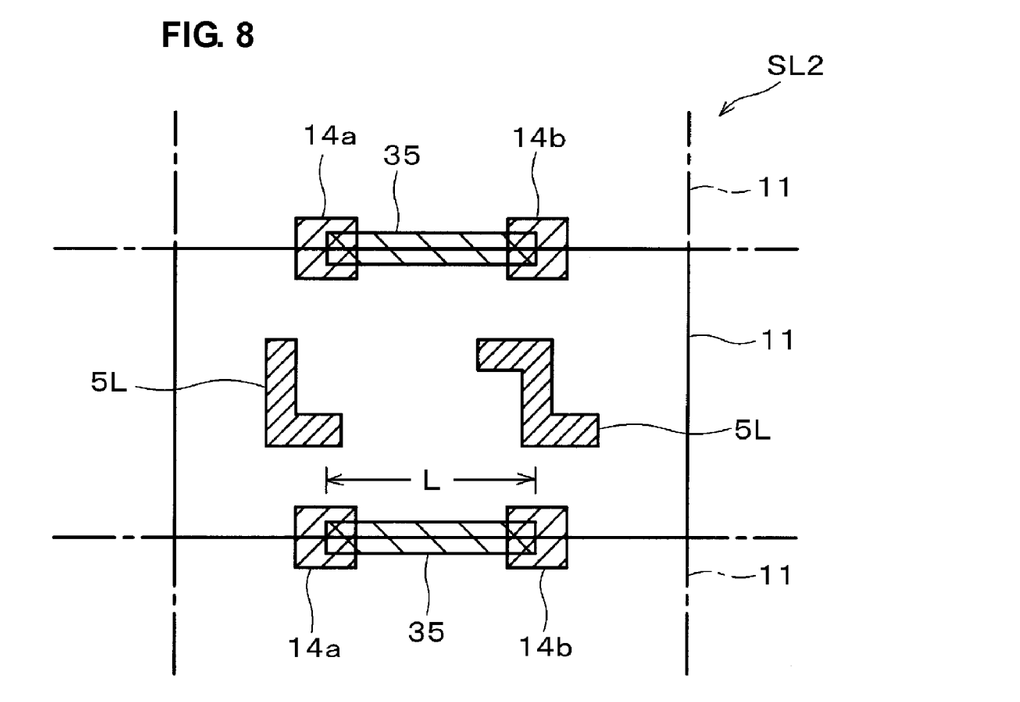
FIG. 8 is an illustration showing the method of exposing an inner-conductor layer at the side surface of the multilayer module body when the inner-conductor layer is coplanar with a wiring inner-conductor, in the manufacturing procedure of the covered multilayer module according to the second preferred embodiment of the present invention.

First, a ceramic green sheet SG2 having a ground-electrode inner-conductor layer 5G as shown in FIG. 7 printed thereon, and a ceramic green sheet SL2 having a wiring inner-conductor layer 5L as shown in FIG. 8 printed thereon, are prepared as mother ceramic green sheets to form the multilayer module body 1.

A mother ceramic green sheet SG2 having a ground-electrode inner-conductor layer 5G printed thereon is, as shown in FIG. 7, configured such that a pair of through holes 14a and 14b for side electrodes are formed at locations in which recesses for side electrodes are formed, for example, at the upper and lower boundary portions with respect to the adjacent child boards 11. The upper-side protrusion 5G1 and the lower-side protrusion 5G2 extend to ends (in FIG. 7, upper and lower ends) of each child board 11, and are connected to the ground electrode 5G of the adjacent child boards 11. A width W of an upper-side protrusion 5G1 and that of a lower-side protrusion 5G2 of the ground electrode 5G are set such that each of the upper-side protrusion 5G1 and the lower-side protrusion 5G2 extends from one through hole 14a to the other through hole 14b but does not protrude outside of outer ends of the through holes 14a and 14b. In addition, the through holes 14a and 14b are filled with conductive paste for side electrode.

A mother ceramic green sheet SL2 having a wiring inner-conductor layer 5L printed thereon is, as shown in FIG. 8, configured such that a pair of through holes 14a and 14b for side electrodes are formed at locations in which recesses for side electrodes are formed, for example, at the upper and lower boundary portions with respect to the adjacent child boards 11. In addition, the wiring inner-conductor layer 5L is disposed, and band-shaped floating electrodes 35 are provided, each extending from the one through hole 14a to the other through 14b formed at each of the boundary portions with respect to the adjacent child boards 11, but not protruding outside of the outer ends of the through holes 14a and 14b. The length L of the floating electrodes 35 is substantially the same as the width W of the upper-side protrusion 5G1 and that of the lower-side protrusion 5G2 of the ground electrode 5G.

Next, the ceramic green sheets SG2 and SL2 with the configurations as shown in FIGS. 7 and 8 are laminated, and then, by applying a method similar to that of the first preferred embodiment, as shown in FIG. 6, the multilayer module body 1 can be obtained in which each of the plurality of inner conductor layers 5 exposed at the side surface 3 of the multilayer module body 1 extends from one of the adjacently arranged pair of side electrodes 4a and 4b towards the other of the adjacently arranged pair of side electrodes 4a and 4b, but does not extend to the regions outside the side electrodes 4a and 4b.

Then, the metal case is bonded and fixed to the multilayer module body 1 in a similar manner to the first preferred embodiment, thereby obtaining a highly reliable multilayer module having a large bonding strength of the metal case, as in the first preferred embodiment.

With the multilayer module according to the second preferred embodiment, advantages similar to those of the first preferred embodiment are obtained.

Third Preferred Embodiment

Figure 9:
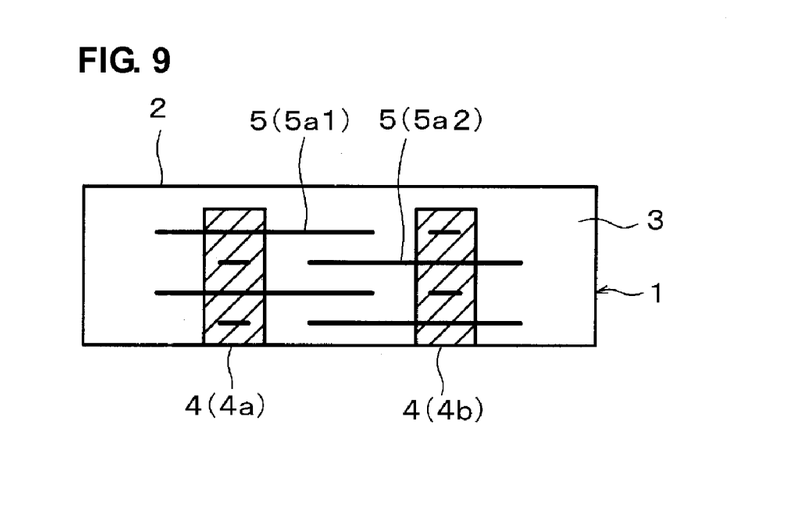
FIG. 9 is an illustration showing a side surface of a multilayer module body of a covered multilayer module according to a third preferred embodiment of the present invention.

FIG. 9 is an illustration showing a structure of a side surface of a multilayer module body of a multilayer module according to a third preferred embodiment of the present invention.

As shown in FIG. 9, in the multilayer module of the third preferred embodiment, two side electrodes 4a and 4b, and an inner conductor exposed portion 5a1 an inner conductor exposed portion 5a2 are provided at a side surface 3 of a multilayer module body 1. The inner conductor exposed portion 5a1 protrudes from left and right ends of one side electrode 4a but does not extend to the other side electrode 4b. The inner conductor exposed portion 5a2 protrudes from left and right ends of the other side electrode 4b, but does not extend to the one side electrode 4a. Tip end portions of the inner conductor exposed portions 5a1 and 5a2 located between the side electrodes 4a and 4b are arranged so as to be superposed when viewed in a lamination direction of ceramic layers.

A multilayer module according to the third preferred embodiment may be manufactured, for example, by a method described below.

Figure 10:
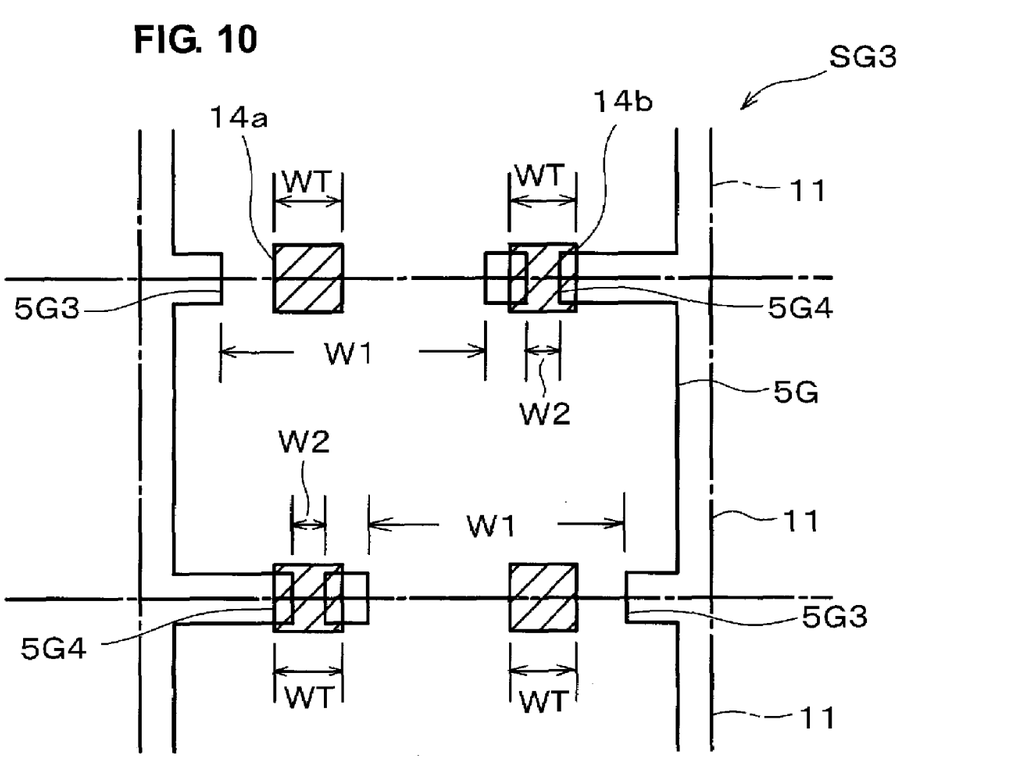
FIG. 10 is an illustration showing a method of exposing a ground-electrode inner-conductor layer at the side surface of the multilayer module body, in a manufacturing procedure of the covered multilayer module according to the third preferred embodiment of the present invention.
Figure 11:
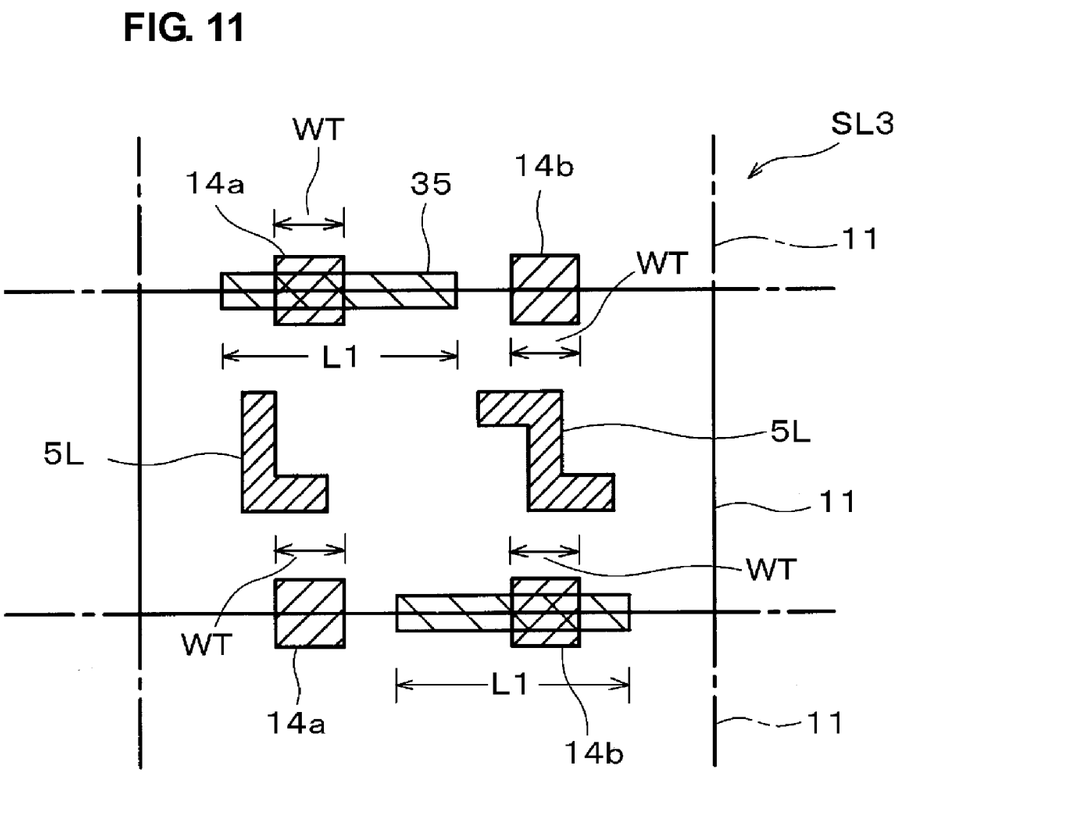
FIG. 11 is an illustration showing a method of exposing an inner-conductor layer at the side surface of the multilayer module body when the inner-conductor layer is coplanar with a wiring inner-conductor, in the manufacturing procedure of the covered multilayer module according to the third preferred embodiment of the present invention.

First, a ceramic green sheet SG3 having a ground-electrode inner-conductor layer 5G as shown in FIG. 10 printed thereon, and a ceramic green sheet SL3 having a wiring inner-conductor layer 5L as shown in FIG. 11 printed thereon are prepared as mother ceramic green sheets for the multilayer module body 1.

A ceramic green sheet SG3 having the ground-electrode inner-conductor layer 5G printed thereon is, as shown in FIG. 10, configured such that a pair of through holes 14a and 14b for side electrodes are formed at locations in which recesses for side electrodes are formed, for example, at upper and lower boundary portions with respect to adjacent child boards 11, and a protrusion 5G3 and a protrusion 5G4 are provided in each of upper and lower regions including the through holes 14a and 14b. The protrusion 5G3 has a width W1 which is greater than a width WT of the through holes 14a and 14b. The protrusion 5G4 has a width W2 which is less than the width WT of the through holes 14a and 14b. The ground-electrode inner-conductor layer 5G is printed such that the positional relationship between the two protrusions 5G3 and 5G4 having the different widths is bilaterally symmetrical at the upper and lower portions. In addition, the through holes 14a and 14b are filled with conductive paste to define side electrodes.

A ceramic green sheet SL3 having the wiring inner-conductor layer 5L printed thereon is, as shown in FIG. 11, configured such that a pair of through holes 14a and 14b for side electrodes are formed at locations in which recesses for side electrodes are formed, for example, at each of upper and lower boundary portions with respect to adjacent child boards 11. In addition, band-shaped floating electrodes 35 are provided at the upper and lower portions. One floating electrode 35 in the upper portion of the single child board 11 has a length L1 substantially same as the width W1 of the protrusion 5G3 at the upper portion of the ground electrode 5G such that the one floating electrode 35 is only superposed on one through hole 14a, and protrudes from left and right ends of the one through hole 14a. The other floating electrode 35 in the lower portion has a length L1 substantially same as the width W1 of the protrusion 5G3 at the lower portion of the ground electrode 5G such that the other floating electrode 35 is only superposed on the other through hole 14b, and protrudes from left and right ends of the other through hole 14b.

Though not specifically shown, a mother ceramic green sheet to be laminated on lower and upper layers of the above-described ceramic green sheets is prepared. In the ceramic green sheet, band-shaped floating electrodes 35 are preferably provided at upper and lower portions such that one floating electrode 35 in the upper portion of the single child board 11 is only superposed on the other through hole 14b and protrudes from the left and right ends of the other through hole 14b, and the other floating electrode 35 in the lower portion is only superposed on the one through hole 14a and protrudes from the left and right ends of the one through hole 14a, in a manner substantially opposite to the green sheet shown in FIG. 11. Particularly, the configuration of the ceramic green sheet is substantially the same as the one of the ceramic green sheet shown in FIG. 11 rotated at 180° in plan view. The ceramic green sheet shown FIG. 11 can preferably be used as the green sheets to be laminated on the upper and lower layers of predetermined green sheets.

These ceramic green sheets are laminated, and thereafter, a method similar to that of the first preferred embodiment is used. Accordingly, as shown in FIG. 9, the multilayer module body 1 can be provided, which has a configuration such that the side electrodes 4a and 4b, and the inner conductor exposed portions 5a1 and 5a2 are provided at the side surface 3 of the multilayer module body 1, and the tip end portions of the inner conductor exposed portions 5a1 and 5a2 located between the side electrodes 4a and 4b are superposed when viewed in the lamination direction of the ceramic layers.

Then, the metal case is bonded and fixed to the multilayer module body 1 in a manner similar to that of the first preferred embodiment, thereby obtaining a highly reliable multilayer module having a large bonding strength of the metal case. As in the first embodiment.

With the multilayer module according to the third preferred embodiment, advantages similar to those of the first preferred embodiment are obtained.

In the above-described preferred embodiments, while the inner conductor exposed portion 5a is exposed at the layer provided with the ground electrode 5G and at the layer provided with the wiring inner-conductor layer 5L, the inner conductor exposed portion 5a may be exposed only at one of these layers.

The inner conductor layers may be exposed at desired layers including one type or both types of layers.

In particular, with preferred embodiments of the present invention, the inner conductor exposed portion may be formed in either manner or both manners listed below:

(1) a method of forming the inner conductor exposed portion using the ground electrode, and (2) a method of allowing the inner conductor exposed portion to be exposed at the side surface from the layer provided with the wiring inner-conductor layer.

When the inner conductor layer is printed on the ceramic green sheet, the printing procedure is not complicated even if the inner conductor layer is printed at the same time. Accordingly, by printing the inner conductor layers at the same time on the layer on which the ground-electrode inner-conductor layer is printed and on the layer on which the wiring inner-conductor layer is printed, and allowing the inner conductor exposed portions to be exposed at the layers provided with the inner conductor layers, the multilayer module can be efficiently manufactured in which many inner conductor exposed portions are exposed at the side surface of the multilayer module body and the metal case is bonded to the multilayer module with high reliability.

The present invention is not limited to the above-described preferred embodiments, and various applications and modifications can be made within the scope of the invention, for the specific configuration of the multilayer module body (for example, the lamination condition of the ceramic layer and the inner conductor layer, the specific shape of the inner conductor layer, the type and mounting manner of the mount devices, and the like), the shape of the exposed portion of the side electrode and the inner conductor layer, the positional relationship between the side electrode and the inner conductor layer, the specific structure of the metal case, and other parameters of the multilayer module body.

As described above, with preferred embodiments of the present invention, the highly reliable multilayer module is provided in which the bonding strength of the metal case with respect to the multilayer module body is greatly improved, without using any special elements or increasing the size of a product.

Therefore, the present invention can be widely applied to covered multilayer modules used for various purposes.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A covered multilayer module comprising:
   a multilayer module body including a multilayer board and a mount device mounted on the multilayer board; and
   a metal case arranged to cover at least one principal surface of the multilayer module body; wherein
   the multilayer module body includes a plurality of laminated ceramic layers and at least one inner conductor layer, the inner conductor layer being disposed between the ceramic layers;
   the multilayer module body includes a pair of opposed principal surfaces and side surfaces connecting the pair of opposed principal surfaces;
   a plurality of side electrodes extending in a lamination direction of the ceramic layers are provided at least at one of the side surfaces;
   the at least one inner conductor layer is exposed at the at least one of the side surfaces provided with the plurality of side electrodes in a region interposed between an adjacently arranged pair of the side electrodes; and
   the metal case includes a top plate and a claw portion, the claw portion being arranged to extend along the at least one of the side surfaces of the multilayer module body provided with the side electrodes, and the claw portion is soldered to the side electrodes and the inner conductor layer exposed at the at least one of the side surfaces.

2. The covered multilayer module according to claim 1, wherein the at least one inner conductor layer includes a plurality of inner conductor layers, and the plurality of inner conductor layers are exposed at the at least one of the side surfaces of the multilayer module body in the region interposed between the adjacently arranged pair of side electrodes such that at least a portion of one of the inner conductor layer is superposed on another one of the inner conductor layers when viewed in the lamination direction of the ceramic layers.

3. The covered multilayer module according to claim 1, wherein the at least one inner conductor layer includes a plurality of inner conductor layers, and one of the inner conductor layers is exposed at the at least one of the side surfaces of the multilayer module body such that the inner conductor layer extends from one of the adjacently arranged pair of side electrodes to the other of the adjacently arranged pair of side electrodes.

* * * * *